US009722036B2

(12) United States Patent
Hirler et al.

(10) Patent No.: US 9,722,036 B2
(45) Date of Patent: Aug. 1, 2017

(54) SEMICONDUCTOR DEVICE WITH FIELD ELECTRODE STRUCTURE

(71) Applicant: Infineon Technologies Austria AG, Villach (AT)

(72) Inventors: Franz Hirler, Isen (DE); Oliver Blank, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/839,472

(22) Filed: Aug. 28, 2015

(65) Prior Publication Data

US 2016/0079376 A1    Mar. 17, 2016

(30) Foreign Application Priority Data

Sep. 17, 2014 (DE) .................. 10 2014 133 375

(51) Int. Cl.
  *H01L 29/40* (2006.01)
  *H01L 29/06* (2006.01)
  *H01L 29/78* (2006.01)
  *H01L 29/417* (2006.01)

(52) U.S. Cl.
  CPC ........ *H01L 29/407* (2013.01); *H01L 29/0623* (2013.01); *H01L 29/0696* (2013.01); *H01L 29/41758* (2013.01); *H01L 29/7806* (2013.01); *H01L 29/7813* (2013.01)

(58) Field of Classification Search
  CPC ............... H01L 29/407; H01L 29/0623; H01L 29/41758; H01L 29/7813; H01L 29/0696; H01L 29/7806; H01L 21/823437; H01L 21/823456; H01L 21/823443; H01L 21/82345; H01L 21/823468; H01L 21/8238; H01L 29/0834; H01L 29/0869; H01L 29/0886; H01L 29/41733; H01L 29/42324; H01L 29/42336; H01L 29/4234
  USPC .................................................. 257/490, 328
  See application file for complete search history.

(56) References Cited

U.S. PATENT DOCUMENTS

| 8,093,621 B2 * | 1/2012 | Parthasarathy | H01L 29/407 257/129 |
| 2007/0108511 A1 * | 5/2007 | Hirler | H01L 29/407 257/328 |
| 2009/0140327 A1 * | 6/2009 | Hirao | H01L 29/407 257/328 |
| 2010/0065903 A1 * | 3/2010 | Parthasarathy | H01L 29/0657 257/329 |

FOREIGN PATENT DOCUMENTS

| EP | DE 10 2005 052 A1 734 | 4/2007 |
| EP | DE 10 2013 205 A1 153 | 9/2013 |

* cited by examiner

*Primary Examiner* — Yasser A Abdelaziez
(74) *Attorney, Agent, or Firm* — Murphy, Bilak & Homiller, PLLC

(57) ABSTRACT

According to an embodiment a semiconductor device includes a semiconductor body with a mesa section that may include a rectifying structure and a first drift zone section. The mesa section surrounds a field electrode structure that includes a field electrode and a field dielectric sandwiched between the field electrode and the semiconductor body. A maximum horizontal extension of the field electrode in a measure plane parallel to a first surface of the semiconductor body is at most 500 nm.

12 Claims, 12 Drawing Sheets

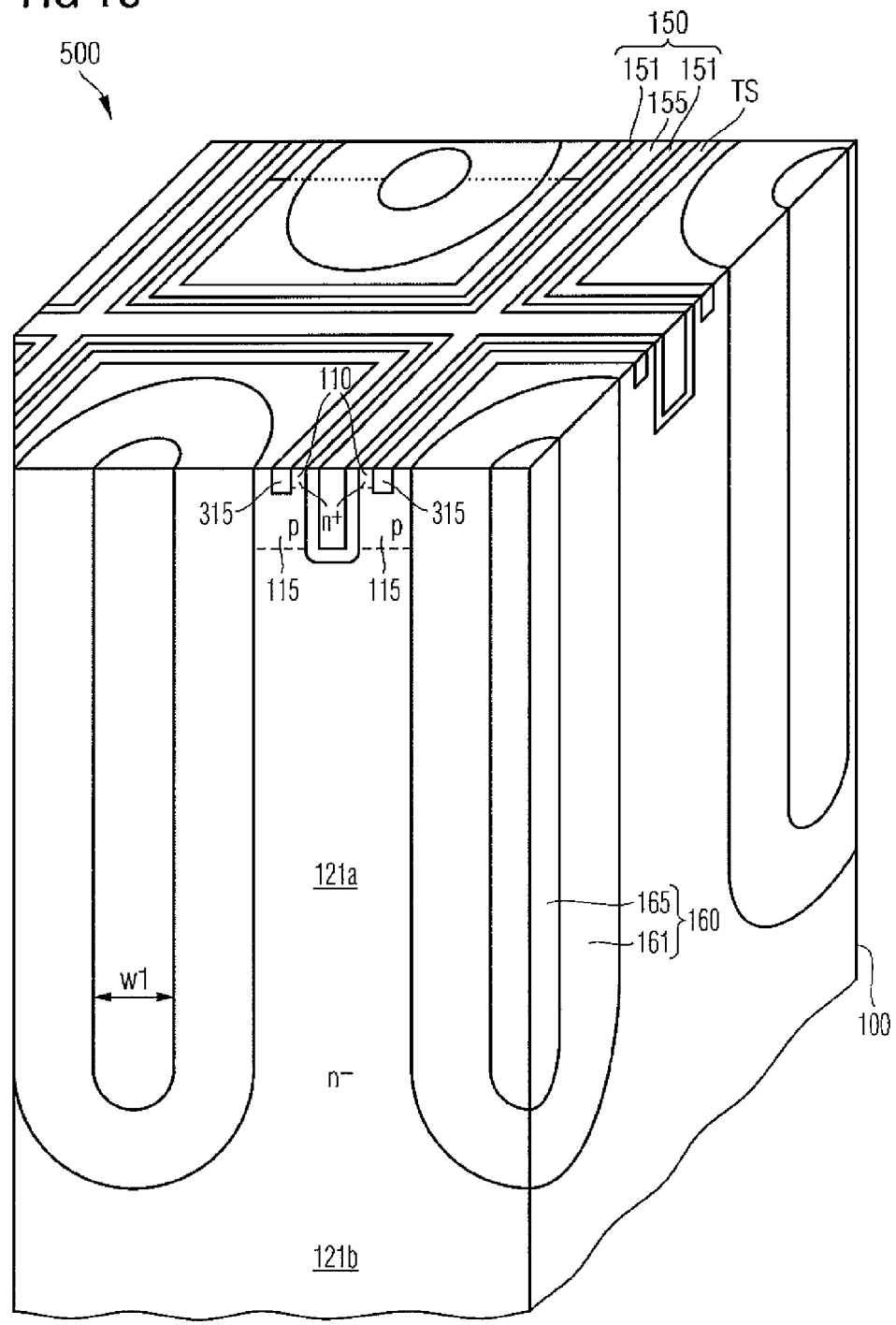

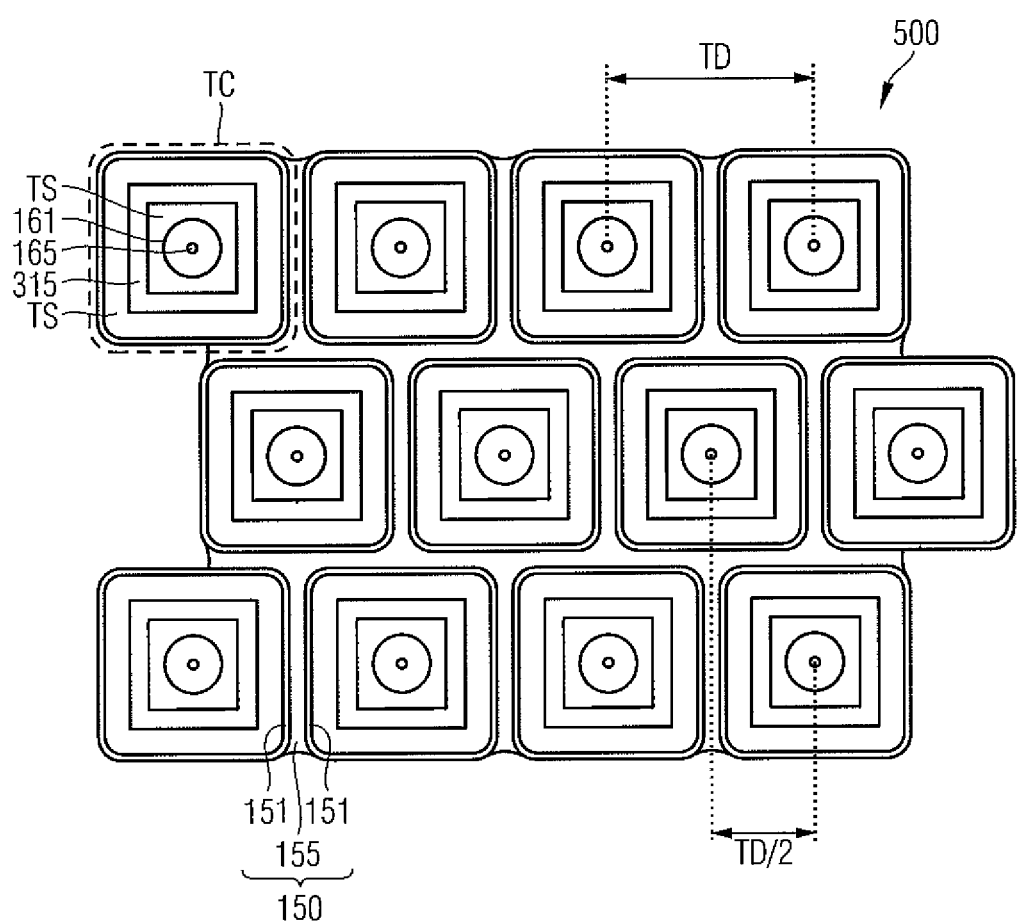

SEMICONDUCTOR DEVICE WITH FIELD ELECTRODE STRUCTURE

BACKGROUND

The present application claims priority under 35 USC §119 to German (DE) Patent Application Serial No. DE 10 2014 113 375.7 filed on Sep. 17, 2014. The disclosure in this priority application is hereby incorporated fully by reference into the present application.

BACKGROUND ART

Power semiconductor devices such as IGFETs (insulated gate field effect transistors) and IGBTs (insulated gate bipolar transistors) are typically vertical devices with a load current flow between a first surface at a front side of a semiconductor die and a second surface at a rear side. In a blocking mode, stripe-shaped compensation structures extending from the front side into the semiconductor die deplete a drift zone in the semiconductor die. The compensation structures allow higher dopant concentrations in the drift zone without adverse impact on the blocking capabilities. Higher dopant concentrations in turn reduce the on state resistance of the device.

It is desirable to provide reliable semiconductor devices with low ohmic losses.

SUMMARY

According to an embodiment a semiconductor device includes a semiconductor body with a mesa section that includes a rectifying structure and a first drift zone section. The mesa section surrounds a field electrode structure that includes a field electrode and a field dielectric sandwiched between the field electrode and the semiconductor body. A maximum horizontal extension of the field electrode in a measure plane parallel to a first surface of the semiconductor body is at most 500 nm.

According to another embodiment an electronic assembly includes a semiconductor device that includes a semiconductor body with a mesa section. The mesa section includes a rectifying structure and a first drift zone section. The mesa section surrounds a field electrode structure that includes a field electrode and a field dielectric sandwiched between the field electrode and the semiconductor body. A maximum horizontal extension of the field electrode in a measure plane parallel to a first surface of the semiconductor body is at most 500 nm.

According to another embodiment a semiconductor device includes a semiconductor body with mesa sections. Each mesa section includes a rectifying structure and a first drift zone section. An at least in segments stripe-shaped field electrode structure is sandwiched between two of the mesa sections and includes a field electrode and a field dielectric sandwiched between the field electrode and the semiconductor body. A horizontal width of the field electrode in a measure plane parallel to a first surface of the semiconductor body is at most 100 nm.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a schematic perspective view of the semiconductor device portion of FIG. 1A.

FIG. 2B is a schematic layout of transistor cells as illustrated in FIGS. 1A to 1B according to an embodiment with the transistor cells arranged along shifted lines.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
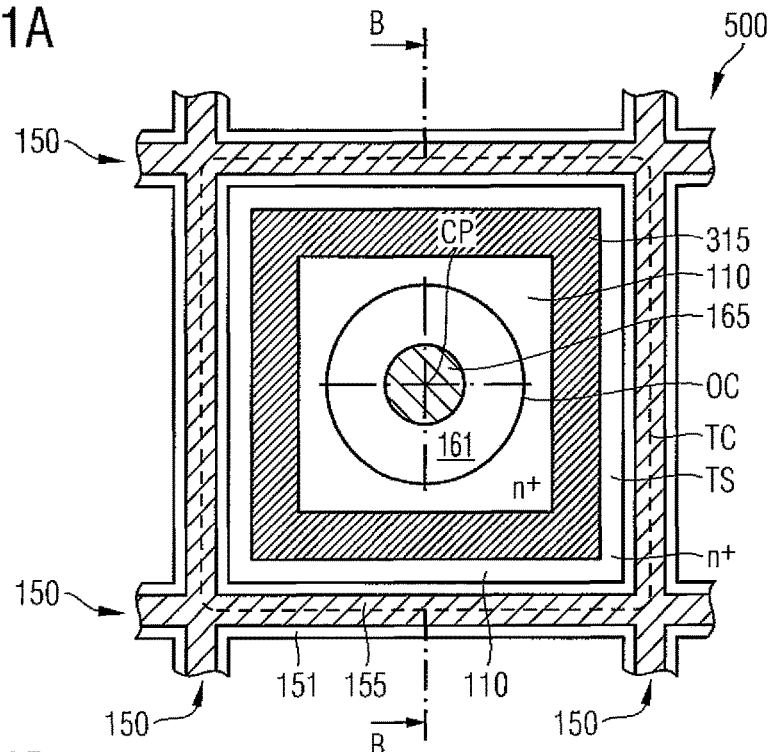
FIG. 1A is a schematic horizontal cross-sectional view of a portion of a semiconductor device according to an embodiment related to a needle-shaped field electrode.
Figure 1B:
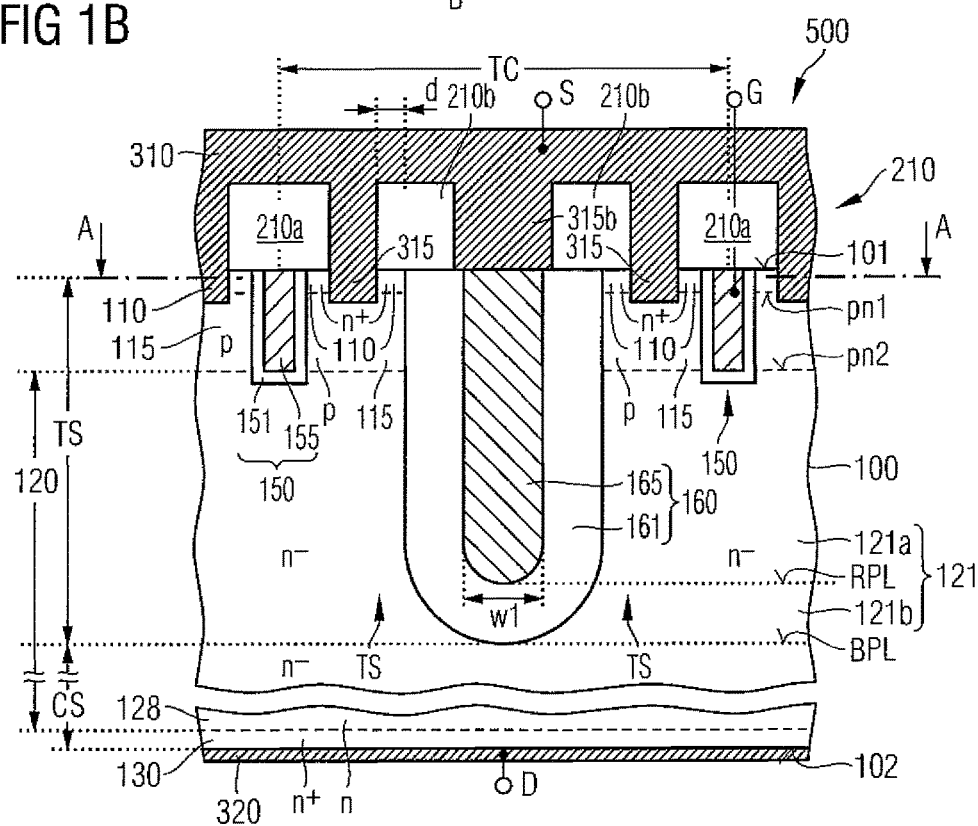
FIG. 1B is a schematic vertical cross-sectional view of the semiconductor device portion of FIG. 1A along line B-B.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with non-metal gates. According to another embodiment, the semiconductor device 500 may be an IGBT.

The semiconductor device 500 is based on a semiconductor body 100 from a single crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a planar second surface 102 parallel to the first surface 101. A distance between the first and second surfaces 101, 102 is selected to achieve a specified voltage blocking capability and may be at least 20 μm. According to other embodiments, the distance may be in the range of several hundred μm. A lateral surface, which is tilted to the first and second surfaces 101, 102 connects the first and second surfaces 101, 102.

In a plane perpendicular to the cross-sectional plane the semiconductor body 100 may have a rectangular shape with an edge length of several millimeters. A normal to the first surface 101 defines a vertical direction and directions orthogonal to the vertical direction are horizontal directions.

The semiconductor body 100 includes a drain structure 120 of a first conductivity type as well as a contact portion 130 of the first conductivity type between the drain structure 120 and the second surface 102. The drain structure 120 includes a drift zone 121, in which a dopant concentration may gradually or in steps increase or decrease with increasing distance to the first surface 101 at least in portions of its vertical extension. According to other embodiments, the dopant concentration in the drift zone 121 may be approximately uniform. A mean dopant concentration in the drift zone 121 may be between 1E15 cm$^{-3}$ and 1E17 cm$^{-3}$, for example in a range from 5E15 cm$^{-3}$ to 5E16 cm$^{-3}$. The drain structure 120 may include further doped zones, for example a field stop layer 128 that separates the drift zone 121 from the contact portion 130. A mean dopant concentration in the field stop layer 128 may be at least five times as high as a mean impurity concentration in the drift zone 121 and at most one-fifth of a maximum dopant concentration in the contact portion 130.

The contact portion 130 may be a heavily doped base substrate or a heavily doped layer. Along the second surface 102 a dopant concentration in the contact portion 130 is sufficiently high to form an ohmic contact with a metal directly adjoining the second surface 102. In case the semiconductor body 100 is based on silicon, in an n-conductive contact portion 130 the dopant concentration along the second surface 102 may be at least 1E18 cm$^{-3}$, for example at least 5E19 cm$^{-3}$. In a p-conductive contact portion 130, the dopant concentration may be at least 1E16 cm$^3$, for example at least 5E17 cm$^{-3}$.

Each transistor cell TC includes a field electrode structure 160 extending from the first surface 101 into the semiconductor body 100 down to a bottom plane BPL. Portions of the field electrode structure 160 between the first surface 101 and buried end portions may have approximately vertical sidewalls or may slightly taper at an angle of, e.g., 89 degree with respect to the first surface 101. The sidewalls may be straight or slightly bulgy.

The field electrode structures 160 include a conductive spicular or needle-shaped field electrode 165 and a field dielectric 161 surrounding the field electrode 165, respectively. The field electrode 165 includes or consists of a heavily doped polycrystalline silicon layer and/or a metal-containing layer. The field dielectric 161 separates the field electrode 165 from the surrounding semiconductor material of the semiconductor body 100 and may include or consist of a thermally grown silicon oxide layer, a deposited silicon oxide layer, e.g. a silicon oxide based on TEOS (tetraethyl orthosilicate), or both.

A vertical extension of the field electrode structure 160 may be smaller than a distance between the first surface 101 and the field stop layer 128 such that a contiguous drift zone section 121b is formed between the field electrode structures 160 and the field stop layer 128. The vertical extension of the field electrode structures 160 may be in a range from 1 μm to 50 μm, for example in a range from 2 μm to 20 μm.

A first horizontal extension of the field electrode 165 may be at most three times or at most twice as large as a second horizontal extension orthogonal to the first horizontal extension. The second horizontal extension may be in a range from 0.1 μm to 20 μm, for example in a range from 0.2 μm to 5 μm.

The cross-sectional areas of the field electrodes 165 and the field electrode structures 160 may be rectangles, or regular or distorted polygons, with or without rounded and/or beveled corners, respectively. According to an embodiment, the first and second horizontal extensions are approximately equal and the cross-sectional areas of the field electrodes 165 and the field electrode structures 160 are regular polygons such as octagons, hexagons or squares, with or without rounded or beveled corners, respectively.

According to other embodiments, the cross-sectional areas of the field electrodes 165 and the field electrode structures 160 may be ellipses or ovals. The first and second horizontal extensions may be approximately equal such that the horizontal cross-sectional areas of the field electrodes 165 and the field electrode structures 160 are circles. With field electrode structures 160 with circular cross-sections their portion of the total cross-sectional area is small compared to field electrode structures 160 with non-circular cross-sections.

The transistor cells TC, which are centered on a horizontal center point CP of the field electrode structures 160, may be arranged matrix-like in lines and rows. According to other embodiments, the transistor cells TC may be arranged in shifted lines, wherein the odd lines are shifted with respect to the even lines by half the distance between two transistor cells TC along the line. Semiconducting portions of the transistor cells TC are formed in mesa sections TS of the semiconductor body 100, wherein the mesa sections TS surround the respective field electrode structure 160. The mesa sections TS protrude from a contiguous section CS of the semiconductor body 100.

Each mesa section TS may include a body zone 115 of the second conductivity type, a first drift zone section 121a of the first conductivity type as well as one or more source zones 110 of the first conductivity type.

Other embodiments may provide diode cells instead of the transistor cells (TC), wherein a diode cell includes a first drift zone section 121a as well as a rectifying structure between the first surface 101 and the first drift zone section 121a. The rectifying structure may be a pn junction with the first drift zone section 121a forming one side of the pn junction, or a Schottky diode.

The first drift zone sections 121a formed between the field electrode structures 160 directly adjoin a contiguous drift zone section 121b formed in the contiguous semiconductor section CS of the semiconductor body 100. In each mesa section TS, the respective body zone 115 forms one or more first pn junctions pn1 with the one or more source zones 110 and a second pn junction pn2 with the first drift zone section 121a. The body zone 115 of a transistor cell TC completely surrounds the respective field electrode structure 160 in horizontal planes.

The source zones 110 may be wells extending from the first surface 101 into the semiconductor body 100, for example into the body zones 115. According to an embodiment, one source zone 110 surrounds the field electrode structure 160 in a horizontal plane. The source zone(s) 110 may directly adjoin the field electrode structure 160 or may be spaced from the field electrode structure 160. According to other embodiments, the field electrode structure 160 of the transistor cell TC is not completely surrounded by one source zone 110 or includes several spatially separated rotational symmetric source zones 110.

An outer contour line of a horizontal cross-sectional area of the mesa section TS may be a circle, an ellipse, an oval or a polygon, i.e. an octagon, a hexagon or a square with or without rounded corners, respectively. An inner contour line of the mesa section TS is defined by the contour of the field electrode structure 160 in the horizontal plane. A horizontal mean width of the mesa section TS may be in a range from 0.2 µm to 10 µm, for example in a range from 0.3 µm to 1 µm.

A gate structure 150 includes a conductive gate electrode 155 surrounding the field electrode structure 160 in horizontal planes within or outside the mesa section TS. According to the illustrated embodiment, the gate structure 150 surrounds the mesa section TS, which in turn surrounds the field electrode structure 160. The gate electrode 155 includes or consists of a heavily doped polycrystalline silicon layer and/or a metal-containing layer.

The gate electrode 155 is completely insulated against the semiconductor body 100, wherein a gate dielectric 151 separates the gate electrode 155 at least from the body zone 115. The gate dielectric 151 capacitively couples the gate electrode 155 to channel portions of the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

According to the illustrated embodiment the gate structure 150 is a trench gate extending from the first surface 101 into the semiconductor body 100.

In the illustrated embodiments and for the following description, the first conductivity type is n-type and the second conductivity type is p-type. Similar considerations as outlined below apply also to embodiments with the first conductivity being p-type and the second conductivity type being n-type.

When a voltage applied to the gate electrode 150 exceeds a preset threshold voltage, electrons accumulate in the channel portions of the body zones 115 directly adjoining the gate dielectric 151 and form inversion channels short-circuiting the second pn junctions pn2 for electrons.

A vertical extension of the gate structures 150 is smaller than the vertical extension of the field electrode structures 160. The vertical extension of the gate structures 150 may be in a range from 100 nm to 5000 nm, for example in a range from 300 nm to 1000 nm.

According to the illustrated embodiment the gate structure 150 surrounds the mesa section TS, such that the field electrode structure 160 and the gate structure 150 sandwich the interjacent mesa section TS with the source and body zones 110, 115. According to other embodiments, the gate structure 150 may be formed between the mesa section TS and the field electrode structure 160.

An interlayer dielectric 210 on the first surface 101 may include first dielectric portions 210a electrically insulating the gate electrodes 155 from a first load electrode 310 provided on the front side as well as second dielectric portions 210b at least partially formed in the vertical projection of the field electrode structure 160.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to a first load terminal, for example the source terminal S in case the semiconductor device 500 is an IGFET. A second load electrode 320, which directly adjoins the second surface 102 and the contact portion 130, may form or may be electrically connected to a second load terminal, which may be the drain terminal D in case the semiconductor device 500 is an IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Sn, Ti, V, Ag, Au, Pt, W, and Pd as main constituent(s), e.g., a silicide, a nitride and/or an alloy.

Contact structures 315 extend through openings in the interlayer dielectric 210 and electrically connect the first load electrode 310 with the source and body zones 110, 115 of the transistor cells TC. Ancillary contact structures 315b may electrically connect the first load electrode 310 with the field electrode 165. The contact structures 315, 315b may include one or more conductive metal containing layers based on, e.g., titanium (Ti) or tantalum (Ta) and a metal fill portion, e.g., based on tungsten (W). According to other embodiments the contact structures 315, 315b include heavily doped semiconductor structures, e.g., heavily n-doped polycrystalline structures or heavily p-doped columnar structures.

According to embodiments providing field electrodes 165 with elongated cross-sectional areas, such as distorted polygons, ovals or ellipses, a maximum horizontal extension is at most 500 nm, for example at most 300 nm. According to an embodiment, the maximum horizontal extension w1 of the field electrodes 165 is at most 100 nm. The maximum horizontal cross-sectional area of the field electrode structure 160 may be 0.2 µm². In case the horizontal cross-sectional area of the field electrodes 165 is a regular polygon, such as an octagon, a hexagon or a square with or without rounded and/or beveled corners, respectively, a diameter of the inscribed circle is at most 500 nm, at most 300 nm, at most 100 nm or at most 50 nm. In case the cross-sectional areas are circles, the diameter of the circle is at most 500 nm, at most 300 nm, at most 100 nm, or at most 50 nm.

The maximum horizontal extensions of the field electrode 165 are defined in a measure plane intersecting a vertical, slightly tapered or slightly bulgy sidewall section of the field electrode 165. The measure plane is at a distance to a reference plane RPL at the bottom of the field electrodes 165, wherein the distance is equal to or greater than a minimum curvature radius in a transition region between the sidewall section of the field electrode 165 and a bottom side of the field electrode 165 in the reference plane RPL, e.g., at a distance of at least 500 nm, 300 nm, 100 nm or 50 nm to the reference plane RBL for curvature radii of 500 nm, 300 nm, 100 nm or 50 nm, respectively. A distance between the first surface 101 and the measure plane is equal to or smaller than the distance between the reference plane RPL and the first surface 101, reduced by the minimum curvature radius. A ratio of the cross-sectional area of the field electrode 165 to the cross-sectional area of the transistor cell TC in the measure plane is at most 0.1 or 0.03.

In the blocking mode, a semiconductor volume between the field electrode structure 160 and the field stop layer 128 in the vertical projection of the field electrode structure 160 is depleted. The charge carriers depleted from this volume contribute to the output charge $Q_{OSS}$ defining the output capacitance $C_{OSS}$. The smaller the portion of the cross-sectional area of the field electrode structures 160 is with respect to the total cross-sectional area of the transistor cell TC, the smaller is the output capacitance $Q_{OSS}$. Reduced output capacitance reduces switching losses and makes the semiconductor device suitable for applications such as switched mode power supplies, motor drives and DC-to-DC converters. Since in the contiguous portion CS between the bottom plane BPL and the field stop layer 128 the dopant concentration in the drift zone 121 may be comparatively high due to outdiffusion of dopants from the field stop layer 128 or the contact portion 130, the contribution of mobile charge carriers assigned to the semiconductor volume in the vertical projection of the field electrode structures 160 is comparatively high. On the other hand, these charge carriers hardly contribute to the reduction of the on-state resistance RDSon, since a current flow through the mesa sections TS spreads in the contiguous section CS only at comparatively long path lengths and since specific conductivity is low due to the high doping concentration.

The contour line of a buried end portion in a vertical cross-section of the field electrode structure 160 may include two quadrants (quarter of a circle) and a section parallel to the first surface 101 between the two quadrants, or two directly adjoining quadrants forming a semicircle such that the buried end portion of the field electrode structure 160 is completely rounded.

Here and in the following the terms quadrant, semi-circle, hemisphere or semi-cylinder are to be understood as target shapes and approximations of the real structures which due to process variations typically deviate from the target shape. The terms quadrant, semi-circle and semi-cylinder include shapes deviating from the target shape by not more than 30%, e.g. at most 20%, of the radius of the target shape.

According to the illustrated embodiment, both the contour lines of the buried tip portions of the field electrode 165 and the contour lines of the buried end portions of the field electrode structures 160 are semi-circles. In other words, the buried tip portions of the field electrodes 165 and the buried end portions of the field electrode structures 160 are hemispheres or deviate from the hemispherical shape by not more than 30% of a radius of the hemisphere such that the field dielectric 161 has a uniform thickness along the complete bottom portion. The uniform thickness of the field dielectric 161 results in a uniform field strength distribution along the field electrode structure 160. Hemispheric end portions for the field electrode 165 and the field electrode structure 160 avoid field peaks that otherwise occur at thinner sections of the field dielectric 161.

The field electrode 165 may be electrically connected to the first load electrode 320, to the gate electrodes 155, to another terminal of the semiconductor device 500, to an output of an internal or external driver circuit, or may float. The field electrode 165 may also be divided in different subelectrodes which may be insulated from each other and which may be coupled to identical or different potentials.

The field electrode structures 160 allow higher dopant concentrations in the drift zone 121 without adversely affecting the blocking capabilities of the semiconductor device 500. The needle-shaped field electrodes 165 increase the available cross-sectional area for the drift zone 121 and therefore reduce the on-state resistance RDSon compared to stripe-shaped field electrodes. Small horizontal cross-sectional areas of the field electrode structures 160 with respect to the total area of the transistor cell TC reduce the effective output capacitance $C_{OSS}$. Contour lines of the field dielectric 161 including two quadrants provide a field dielectric 161 with uniform thickness such that field peaks can be avoided. Semicircular inner and outer contour lines of the field dielectric 161 minimize the output charge $Q_{OSS}$. As a result, the semiconductor device 500 exhibits a low output capacitance $C_{OSS}$.

Figure 2A:
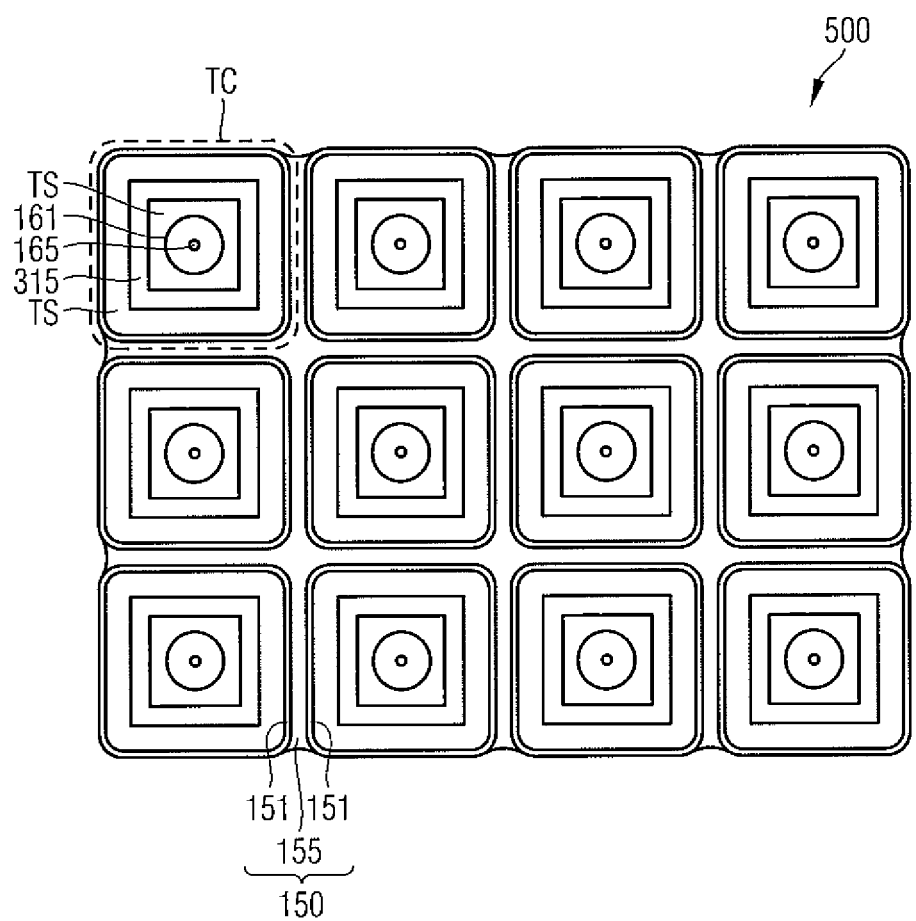
FIG. 2A is a schematic layout of transistor cells as illustrated in FIGS. 1A to 1B according to an embodiment with the transistor cells arranged in a matrix.

FIG. 2A refers to an embodiment with the transistor cells TC of FIGS. 1A to 1C arranged matrix-like in equally spaced parallel lines and rows.

In FIG. 2B the transistor cells TC in odd lines are shifted with respect to that in even lines along the line direction by the half TD/2 center-to-center distance TD between neighboring transistor cells TC along the line.

The description of the further embodiments omits the description of elements described in detail with respect to FIGS. 1A to 1C.

Figure 3A:
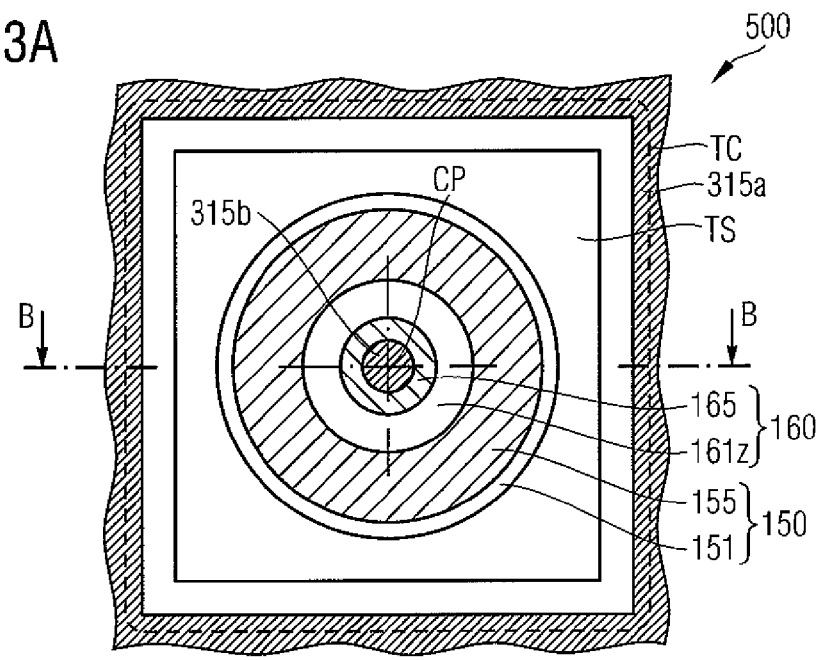
FIG. 3A is a schematic horizontal cross-sectional view of a portion of a semiconductor device according to an embodiment related to ring-shaped gate electrodes formed between the field electrode and the mesa section of the respective transistor cells.
Figure 3B:
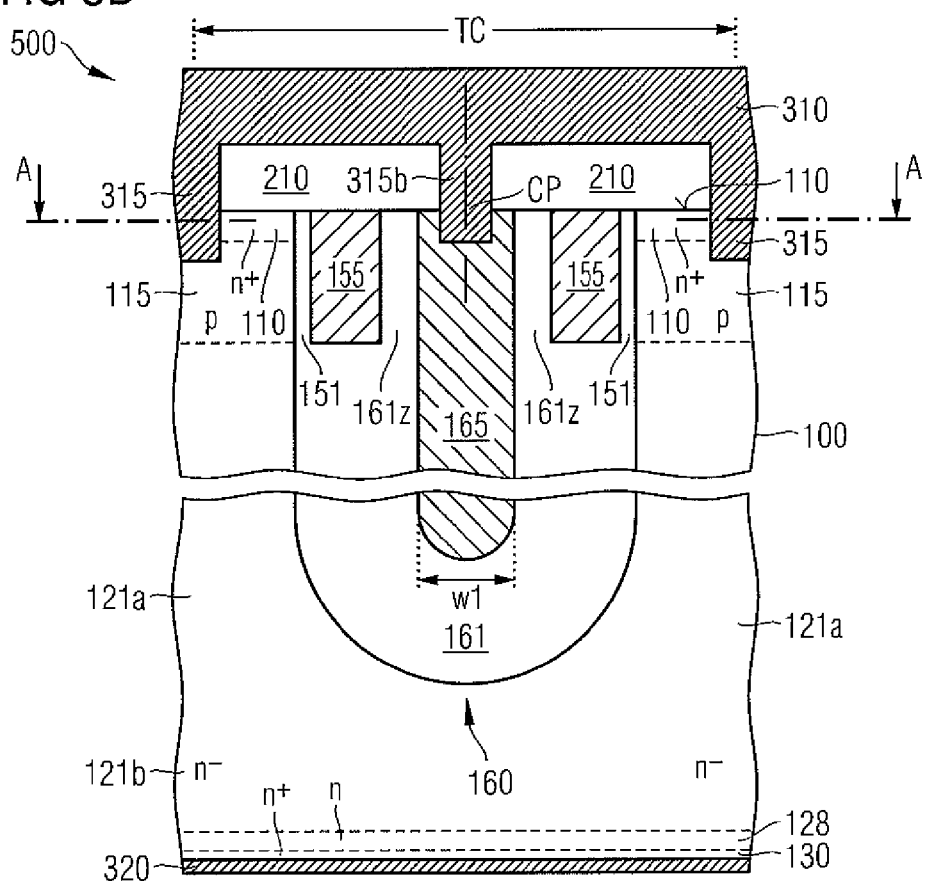
FIG. 3B is a schematic vertical cross-sectional view of the semiconductor device portion of FIG. 3A along line B-B.

In the semiconductor device 500 of FIGS. 3A to 3B, the gate structures 150 are formed between the field electrode structures 160 and the mesa sections TS, respectively. Each gate structure 150 may be formed based on the same trench as provided for the concerned field electrode structure 160, such that an outer contour of the gate structure 150 is formed in the vertical projection of a bottom portion of the field dielectric 161, wherein the bottom portion is the portion oriented to the rear side. The outer contour of the gate structure 160 may be approximately flush with the outer contour of the bottom portion of the field electrode structure 160, wherein, e.g., the gate dielectric 151 may be grown at the expense of the mesa section TS.

According to other embodiments, the gate structure 150 may be formed outside a trench on which the adjacent field electrode structure 160 is based. A portion 161z of the field dielectric 161 separates the field and gate electrodes 165, 155. An ancillary contact structure 315b concentric with the transistor cell TC may electrically connect the field electrode 165 with the first load electrode 310. According to other embodiments the interlayer dielectric 210 insulates the first load electrode 310 from the field electrode 165 and the field electrode 165 may be electrically connected with the gate electrode, a further terminal of the semiconductor device 500, or an output of an internal driver circuit. Alternatively, the field electrode 165 may float.

According to further embodiments, the gate and field electrode structures 150, 160 are arranged along the same vertical axes, wherein the gate structures 150 are formed between the first surface 101 and the field electrode structures 160, respectively, and wherein the gate electrodes 155 may be electrically separated from the field electrodes 165 or electrically connected to the field electrodes 165. For both examples, the field dielectric 161 is thicker than the gate dielectric 151.

Figure 4A:
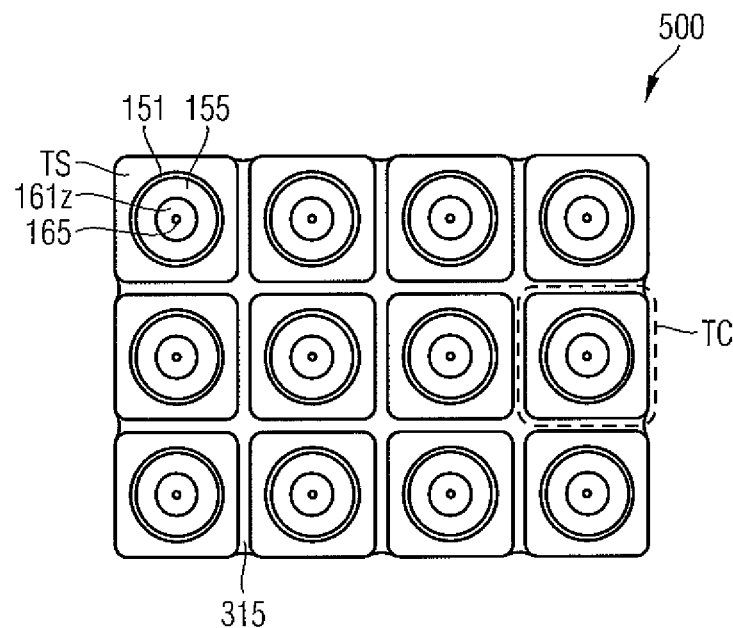
FIG. 4A is a schematic layout of transistor cells as illustrated in FIGS. 3A to 3B according to an embodiment with the transistor cells arranged in a matrix.

The transistor cells TC may be arranged matrix-like in equably spaced parallel lines and rows as illustrated in FIG. 4A.

Figure 4B:
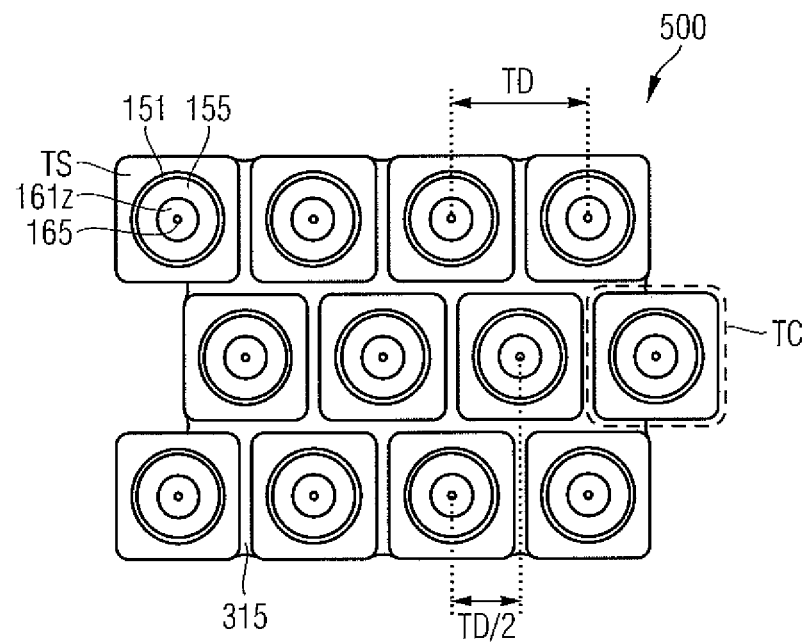
FIG. 4B is a schematic layout of transistor cells as illustrated in FIGS. 3A to 3B according to an embodiment with the transistor cells arranged along shifted lines.

In FIG. 4B the transistor cells TC in odd lines are shifted with respect to that in even lines along the line direction by the half TD/2 center-to-center distance TD between neighboring transistor cells TC along the line.

Figure 5A:
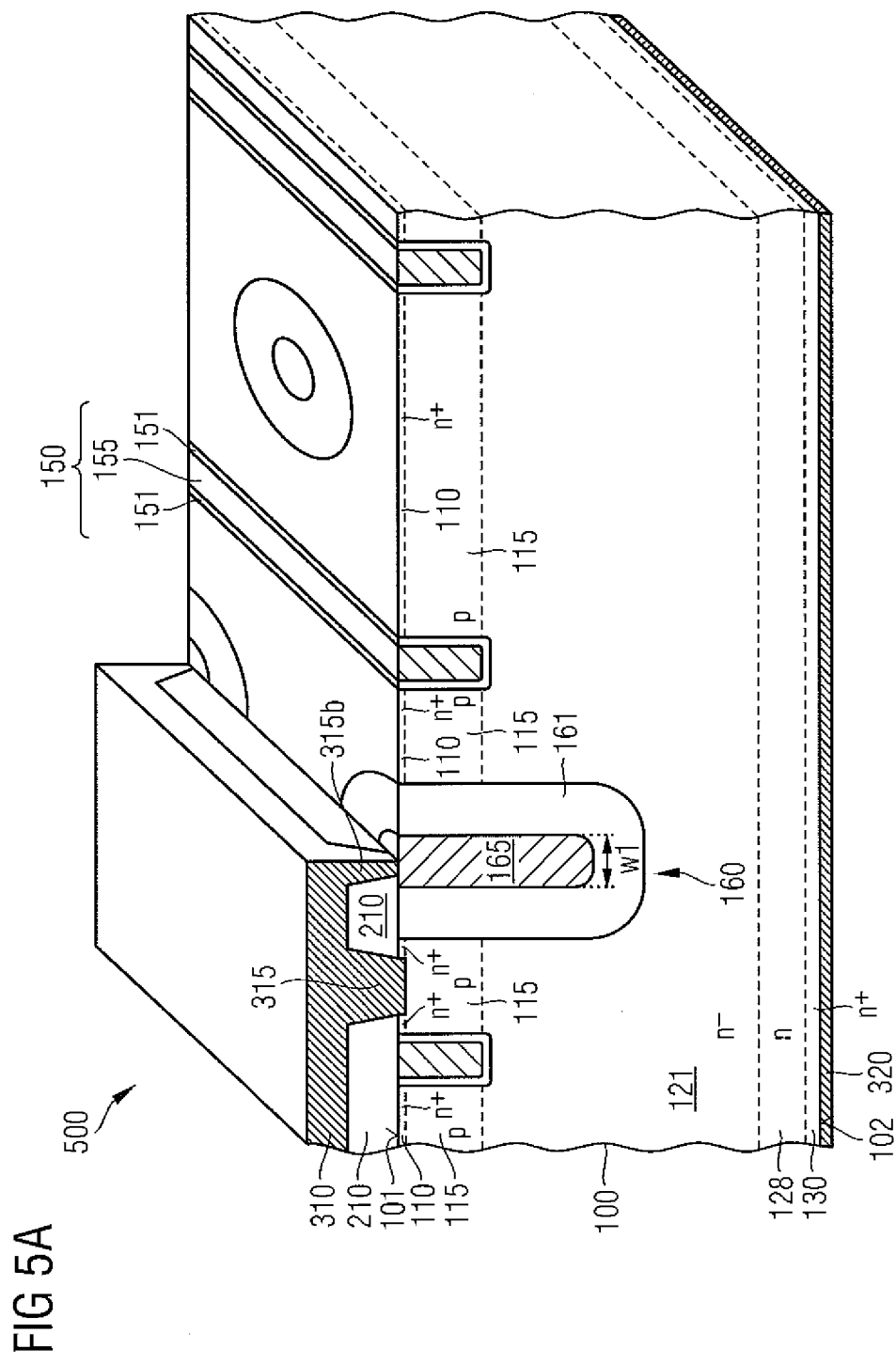
FIG. 5A is a schematic perspective view of a portion of a semiconductor device according to an embodiment related to stripe-shaped gate structures and spatially separated needle-shaped field electrodes.

The semiconductor device 500 of FIG. 5A combines needle-shaped field electrodes 165 with stripe-shaped gate structures 155 and stripe-shaped contact structures 315. Contour lines of the buried tip portions of the field electrodes 165 and the buried end portions of the field electrode structures 160 in the illustrated embodiment include two quadrants and a portion parallel to the first surface 101, respectively. According to other embodiments, the contour lines of the buried tip portion of the field electrode 165 as well as the buried end portion of the field electrode structure 160 are semi-circles and the buried tip portions of the field electrodes 165 as well as the buried end portions of the field electrode structures 160 are hemispheres or deviate from the hemispherical shape by not more than 30% of a radius of the hemisphere. As regards further details of the field electrode structure 160 and the field electrode 165, reference is made to the detailed description of FIGS. 1A to 1C.

Figure 5B:
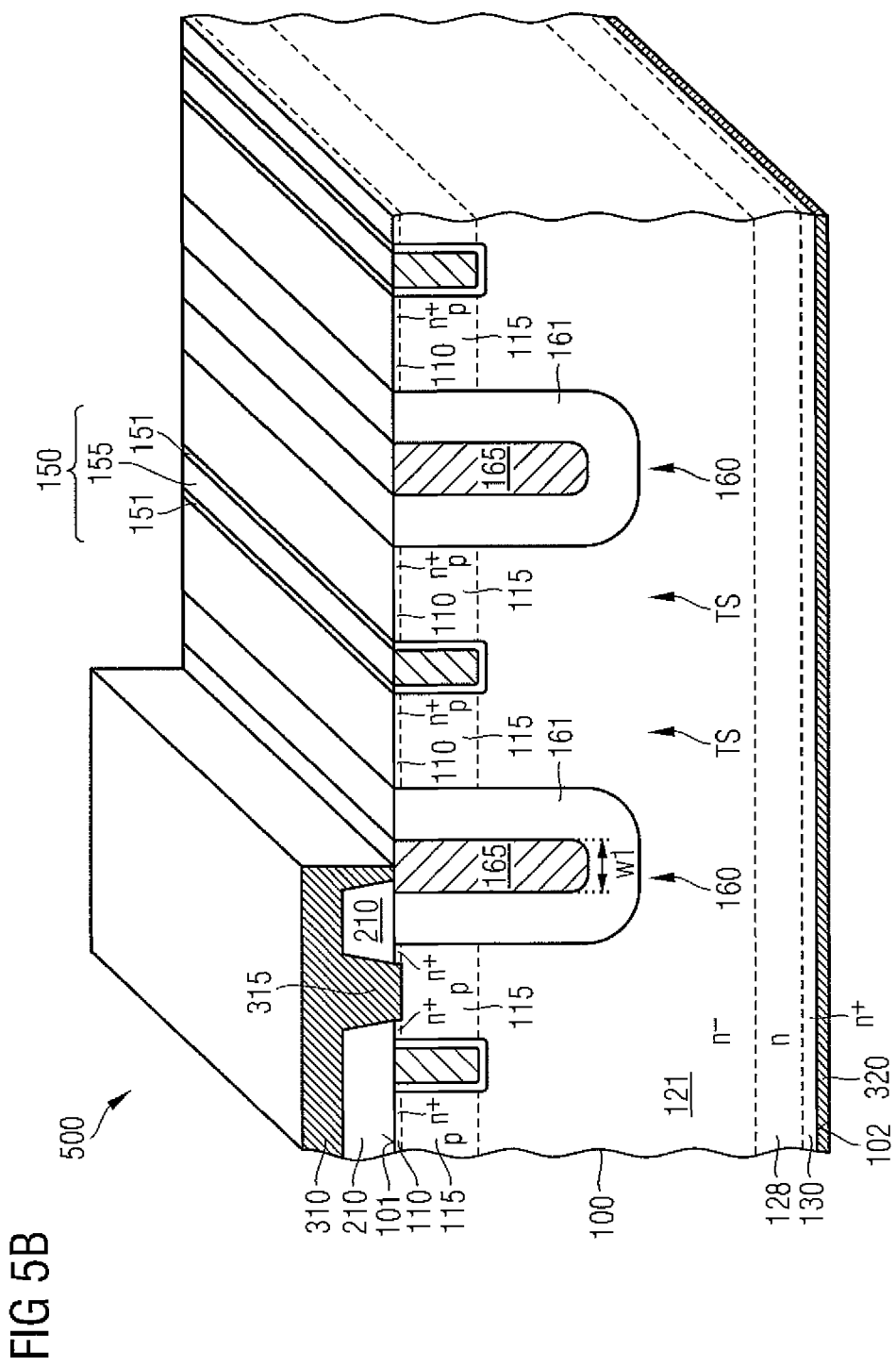
FIG. 5B is a schematic perspective view of a portion of a semiconductor device according to an embodiment related to stripe-shaped field electrodes.

The stripe-shaped field electrodes 165 of FIG. 5B have a maximum horizontal width w1 of at most 100 nm, for example at most 50 nm for reducing $Q_{OSS}$ and $C_{OSS}$. The horizontal width w1 may be defined in a measure plane intersecting a vertical, slightly tapered or slightly bulgy sidewall section of the stripe-shaped field electrode 165. The measure plane is at a distance to a reference plane at the bottom of the field electrodes 165, wherein the distance is equal to or greater than a minimum curvature radius in a transition region between the sidewall section of the field electrodes 165 and a bottom side of the field electrodes 165 along the reference plane.

The contour lines of the vertical cross-sectional areas of the stripe-shaped field electrodes 160 may include two quadrants, respectively, wherein a horizontal contour line section parallel to the first surface may separate the two quadrants or wherein the two quadrants directly adjoin to each other to form a semi-circle. In the latter case, the buried tip portions of the field electrodes 165 as well as the buried end portions of the field electrode structures 160 are half cylinders or deviate from the shape of a half cylinder along the radial direction by at most 30% of a curvature radius of the half cylinder. End faces of the half cylinder may be rounded or may form T-shaped portions with connection structures. Equivalent considerations apply to layouts with the field electrodes 160 forming a grid embedding the mesa sections TS.

Figure 6:
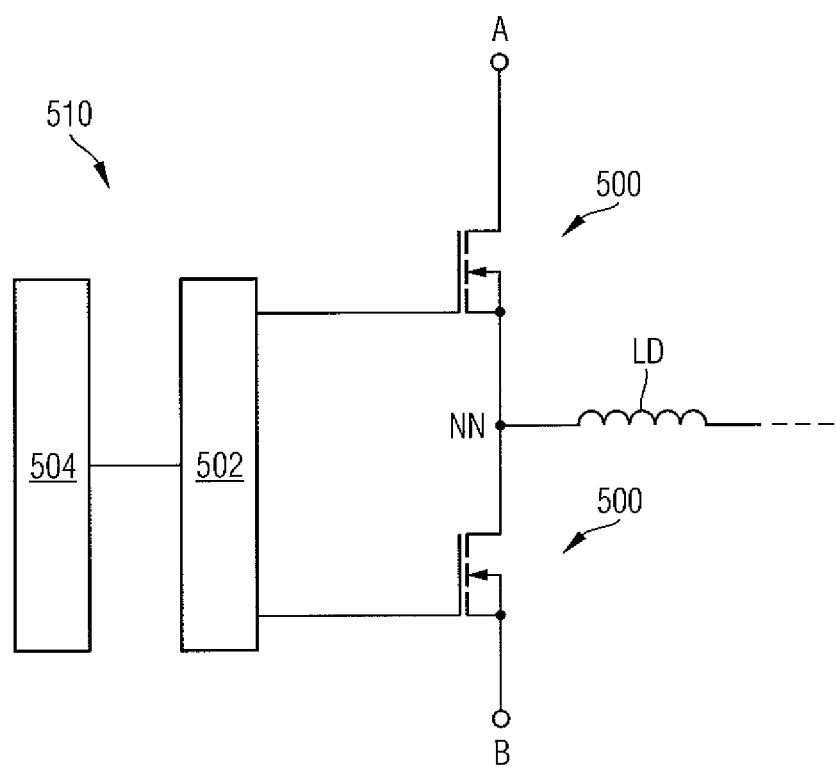
FIG. 6 is a schematic circuit diagram of an electronic assembly according to an embodiment related to switched mode power supplies and motor drives.

FIG. 6 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, the network node NN electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic circuit 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro-inverter for applications including photovoltaic cells, wherein the electronic circuit 510 supplies an output voltage to the supply terminals A, B and wherein the network node NN is electrically connected to the inductive storage element.

Figure 7A:
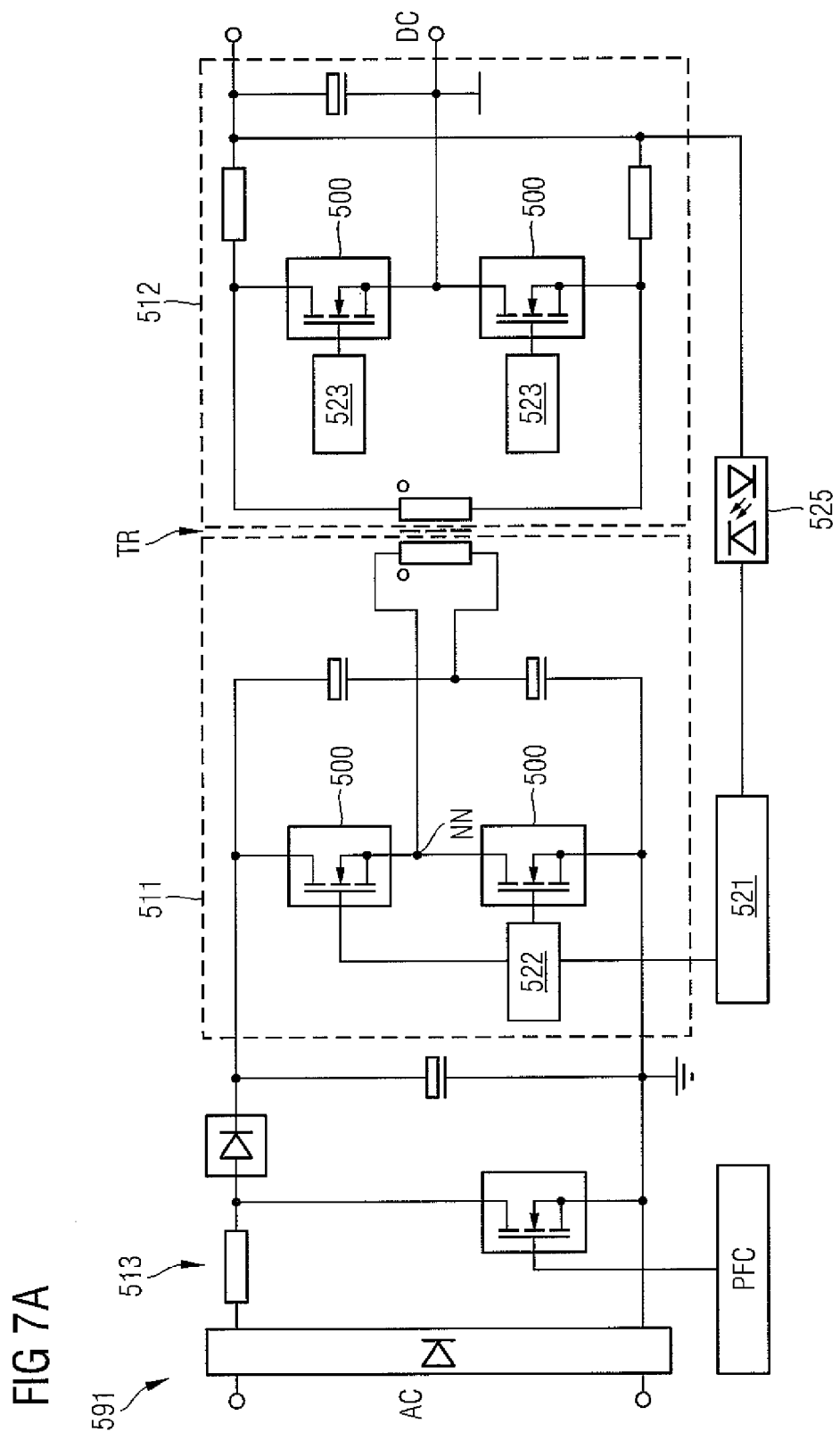
FIG. 7A is a schematic circuit diagram of an electronic assembly according to an embodiment related to a switched mode power supplies.

FIG. 7A refers to a switched mode power supply 591 using semiconductor devices 500 as described above in a primary side stage 511 as well as in a synchronous rectifier 512 at the secondary side.

AC supply voltage is supplied to the primary side stage through a power factor correction unit 513. A pulse width modulation controller 521 controls a gate driver 522 such that two semiconductor devices 500 electrically arranged in series in the primary side stage are alternatively switched on and off. The network node NN between the load paths of the two semiconductor devices 500 is electrically connected to the primary winding of a transformer TR. In the synchronous rectifier 512 at the secondary side, two further semiconductor devices 500 may be electrically arranged in series with respect to each other and, in combination, electrically arranged in parallel to the secondary winding of the transformer TR. Secondary gate drivers 523 alternatingly switch on and off the semiconductor devices 500 of the synchronous rectifier 512. A coupling element 525 that may provide galvanic insulation feeds back the output signal of the synchronous rectifier 512 to the pulse width modulation controller 521 that adapts the timing of the switching cycles in response to varying load conditions.

The low output capacity of the semiconductor devices 500 significantly improves the degree of efficiency of the power conversion, for example in an operation mode with only a light load at the output of the power conversion circuit 591.

Figure 7B:
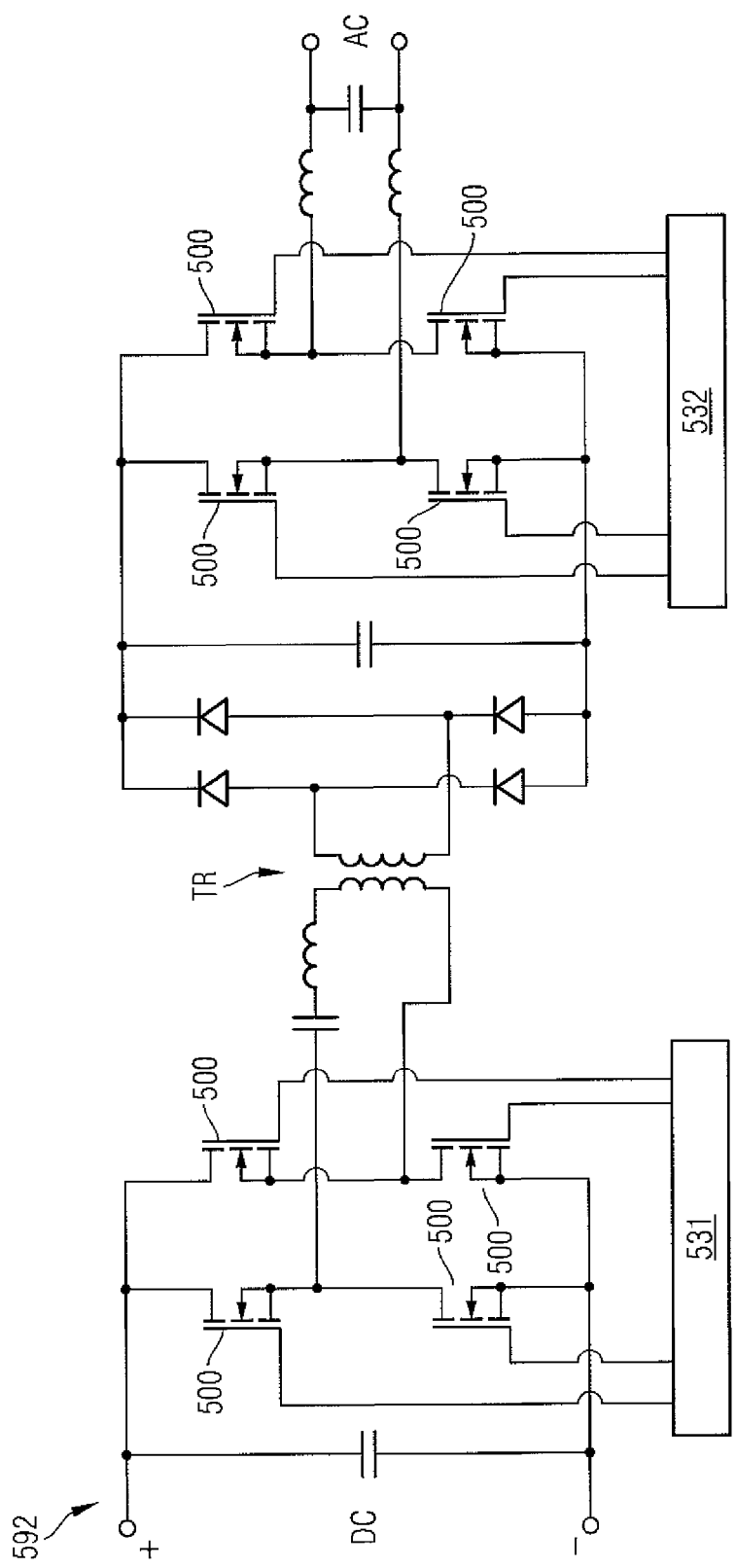
FIG. 7B is a schematic circuit diagram of an electronic assembly according to an embodiment related to a micro-inverter.

The solar micro-inverter 592 of FIG. 7B includes, at a primary side of a transformer TR, two branches with in each case two semiconductor devices 500 used as switches and electrically arranged in a full-bridge-like configuration as regards a primary winding of the transformer TR. A primary side controller unit 531 drives appropriate gate signals for the four semiconductor devices 500 at the primary side to transform the input DC voltage to an intermediate high-frequency AC. A similar arrangement on the secondary side with a secondary side controller unit 532 and further four semiconductor devices 500 used as switches and arranged in a full-bridge-like configuration as regards the output terminals transform the rectified voltage at the secondary stage into an AC voltage of a specified output frequency.

The input DC terminals may be electrically connected to output terminals of a solar panel including photovoltaic cells and the micro-inverter 592 may convert the DC output voltage of the solar panel into an appropriate AC voltage, e.g., 235V at 50 Hz. The low output charge of the switching devices 500 significantly reduces switching losses.

Figure 7C:
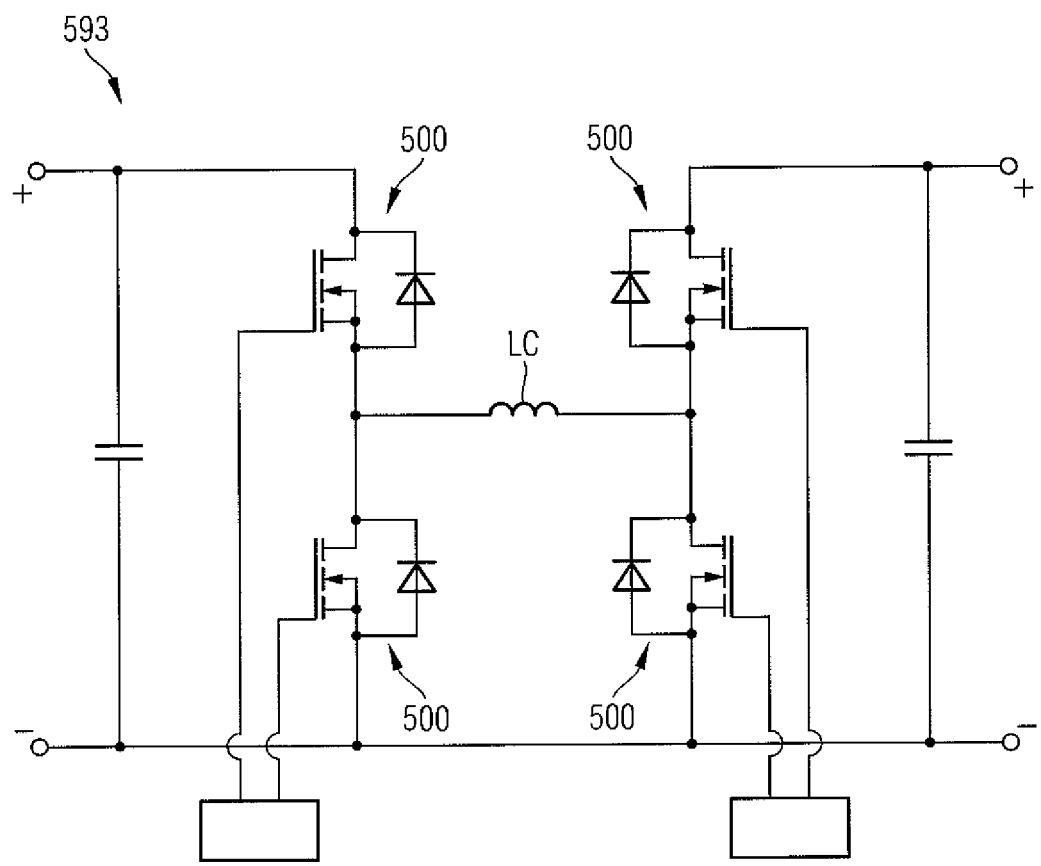
FIG. 7C is a schematic circuit diagram of an electronic assembly according to an embodiment related to a DC-to-DC converter.

FIG. 7C refers to DC-to-DC converter 593, e.g., a power optimizer for solar cells that uses a coil LC as an inductive storage element. The DC-to-DC converter 593 may be a power optimizer for applications concerning photovoltaic cells and may be a hard switching converter where a reduction of the output charge $Q_{OSS}$ significantly improves conversion efficiency.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device comprising:
   a semiconductor body;
   a gate structure extending into the semiconductor body and surrounding a mesa section of the semiconductor body on all sides, the mesa section comprising a rectifying structure and a first drift zone section;
   a field electrode structure surrounded on all sides by the mesa section and comprising a field electrode and a field dielectric sandwiched between the field electrode and the semiconductor body, wherein an extension of the field electrode in a plane approximately parallel to a first surface of the semiconductor body is less than approximately 500 nm,
   wherein the mesa section is sandwiched between the field electrode structure and the gate structure.

2. The semiconductor device of claim 1, wherein the rectifying structure is a pn junction or a Schottky diode.

3. The semiconductor device of claim 1, wherein the rectifying structure comprises a body zone separating a source zone and the first drift zone section, the body zone forming a first pn junction with the source zone and a second pn junction with the first drift zone section.

4. The semiconductor device of claim 3, wherein the gate structure comprises a gate electrode and a gate dielectric separating the gate electrode and the body zone.

5. The semiconductor device of claim 1, wherein gate structures of a plurality of transistor cells form a grid embedding mesa sections of the plurality of transistor cells.

6. The semiconductor device of claim 1, wherein mesa sections of a plurality of transistor cells form a grid embedding the gate structures and field electrode structures of the transistor cells.

7. The semiconductor device of claim 1, wherein a first horizontal extension of the field electrode approximately parallel to the first surface of the semiconductor body is at most twice as large as a second horizontal extension approximately orthogonal to the first horizontal extension.

8. The semiconductor device of claim 1, wherein a horizontal cross-sectional area of the field electrode approximately parallel to the first surface of the semiconductor body is a square with rounded corners or a hexagon with rounded corners.

9. The semiconductor device of claim 1, wherein a vertical cross-sectional shape of a buried end portion of the field electrode structure approximately orthogonal to the first surface of the semiconductor body is devoid of a straight section parallel to the first surface.

10. An electronic assembly, comprising:
    a semiconductor device that comprises a semiconductor body;
    a gate structure extending into the semiconductor body and surrounding a mesa section of the semiconductor body on all sides, the mesa section a rectifying structure and a first drift zone section;
    a field electrode structure surrounded by the mesa section on all sides and comprising a field electrode and a field dielectric sandwiched between the field electrode and the semiconductor body, wherein an extension of the field electrode in a plane approximately parallel to a first surface of the semiconductor body is less than approximately 500 nm, wherein the mesa section is sandwiched between the field electrode structure and the gate structure.

11. The electronic assembly of claim 10, wherein the electronic assembly is selected from a group comprising a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter and a solar power converter.

12. The electronic assembly of claim 10, wherein the rectifying structure comprises a body zone separating a source zone and the first drift zone section, the body zone forming a first pn junction with the source zone and a second pn junction with the first drift zone section.

* * * * *

UNITED STATES PATENT AND TRADEMARK OFFICE
CERTIFICATE OF CORRECTION

PATENT NO. : 9,722,036 B2  
APPLICATION NO. : 14/839472  
DATED : August 1, 2017  
INVENTOR(S) : Hirler et al.

Page 1 of 1

It is certified that error appears in the above-identified patent and that said Letters Patent is hereby corrected as shown below:

On the Title Page

(30) Foreign Application Priority Data, please change "10 2014 133 375" to -- 10 2014 113 375 --.

Signed and Sealed this  
Twenty-sixth Day of September, 2017

Joseph Matal  
*Performing the Functions and Duties of the*  
*Under Secretary of Commerce for Intellectual Property and*  
*Director of the United States Patent and Trademark Office*